(12) United States Patent  
Abe et al.

(10) Patent No.: US 8,440,035 B2
(45) Date of Patent: May 14, 2013

(54) METHOD FOR MANUFACTURING CERAMIC MULTI-LAYERED INTERCONNECTION SUBSTRATE

(75) Inventors: Tomoaki Abe, Tokyo (JP); Kaori Namioka, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 0 days.

(21) Appl. No.: 13/270,076

(22) Filed: Oct. 10, 2011

(65) Prior Publication Data

US 2012/0085481 A1   Apr. 12, 2012

(30) Foreign Application Priority Data

Oct. 8, 2010   (JP) .................................. 2010-228468

(51) Int. Cl.
C03B 29/00   (2006.01)
H05K 1/00    (2006.01)
H05K 1/03    (2006.01)
H05K 1/16    (2006.01)

(52) U.S. Cl.
USPC ............. 156/89.12; 156/89.11; 174/250; 174/255; 174/260

(58) Field of Classification Search ............... 156/89.11, 156/89.12; 174/250, 255
See application file for complete search history.

(56) References Cited

U.S. PATENT DOCUMENTS

| 6,621,010 | B2 * | 9/2003 | Sakai et al. | 174/255 |
| 6,965,161 | B2 * | 11/2005 | Jun et al. | 257/700 |
| 7,432,590 | B2 * | 10/2008 | Nagano et al. | 257/704 |
| 2003/0000079 | A1 * | 1/2003 | Harada et al. | 29/830 |
| 2006/0234021 | A1 * | 10/2006 | Tanei et al. | 428/210 |

FOREIGN PATENT DOCUMENTS

| JP | 09071488 A | * | 3/1997 |
| JP | 2003-249755 A | | 9/2003 |
| JP | 2008-28065 A | | 2/2008 |
| JP | 2008028065 A | * | 2/2008 |

* cited by examiner

*Primary Examiner* — Philip Tucker
*Assistant Examiner* — Alex Efta
(74) *Attorney, Agent, or Firm* — Kenealy Vaidya LLP

(57) ABSTRACT

A ceramic multi-layered interconnection substrate can be manufactured by using a stack including a plurality of ceramic layers with division grooves in the uppermost layer, at least one intermediate layer, and the lowermost layer. The substrate can be manufactured by forming division grooves in respective green sheets other than the uppermost and lowermost ones at adjacent package boundaries, pressing them to be stacked, forming division grooves in the uppermost and lowermost sheets at the adjacent package boundaries, firing them to be ceramic layers, and breaking the ceramic layers along the division grooves to separate individual packages, thus preventing failure and preventing the generation of burrs, chips, and the like.

18 Claims, 24 Drawing Sheets

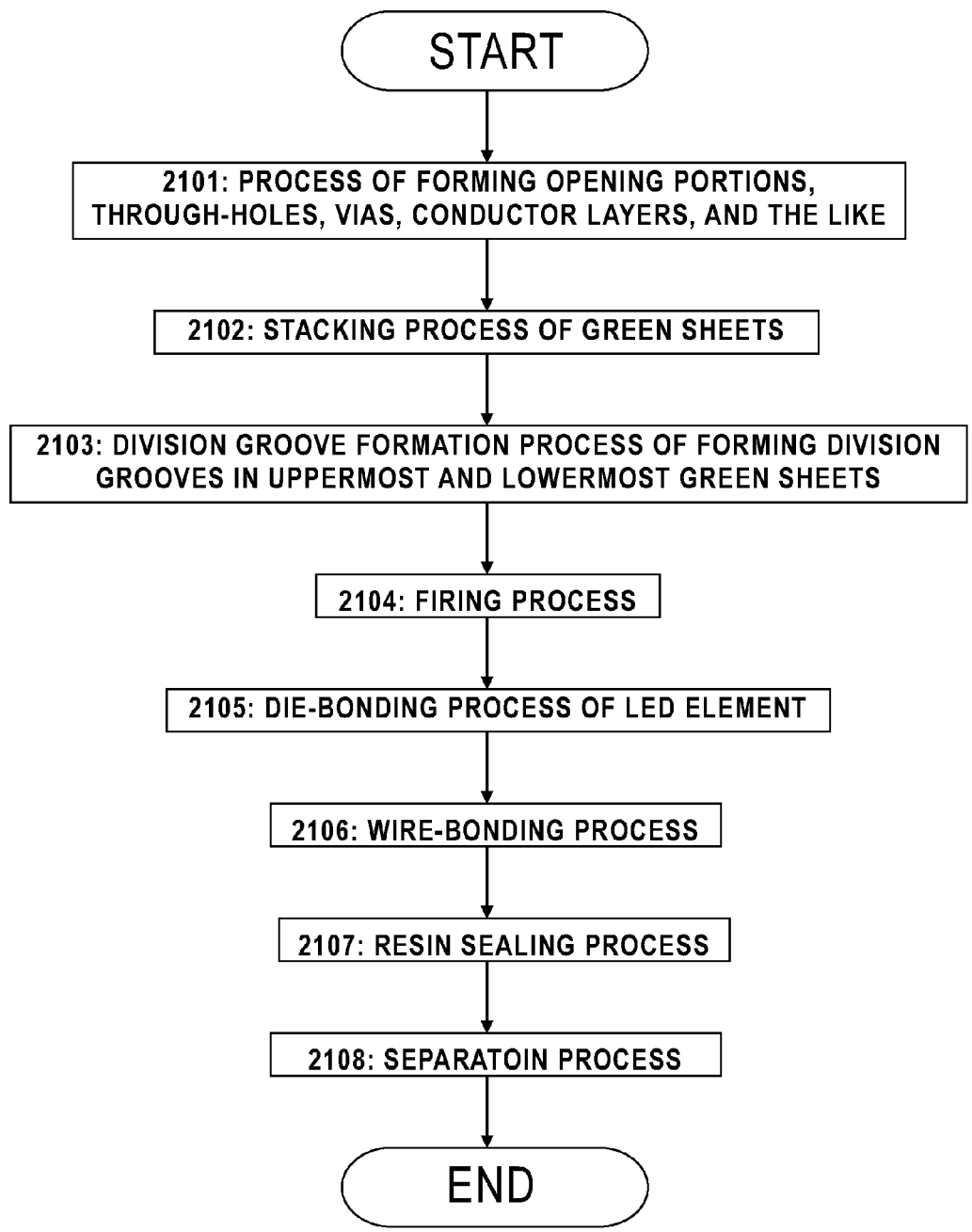

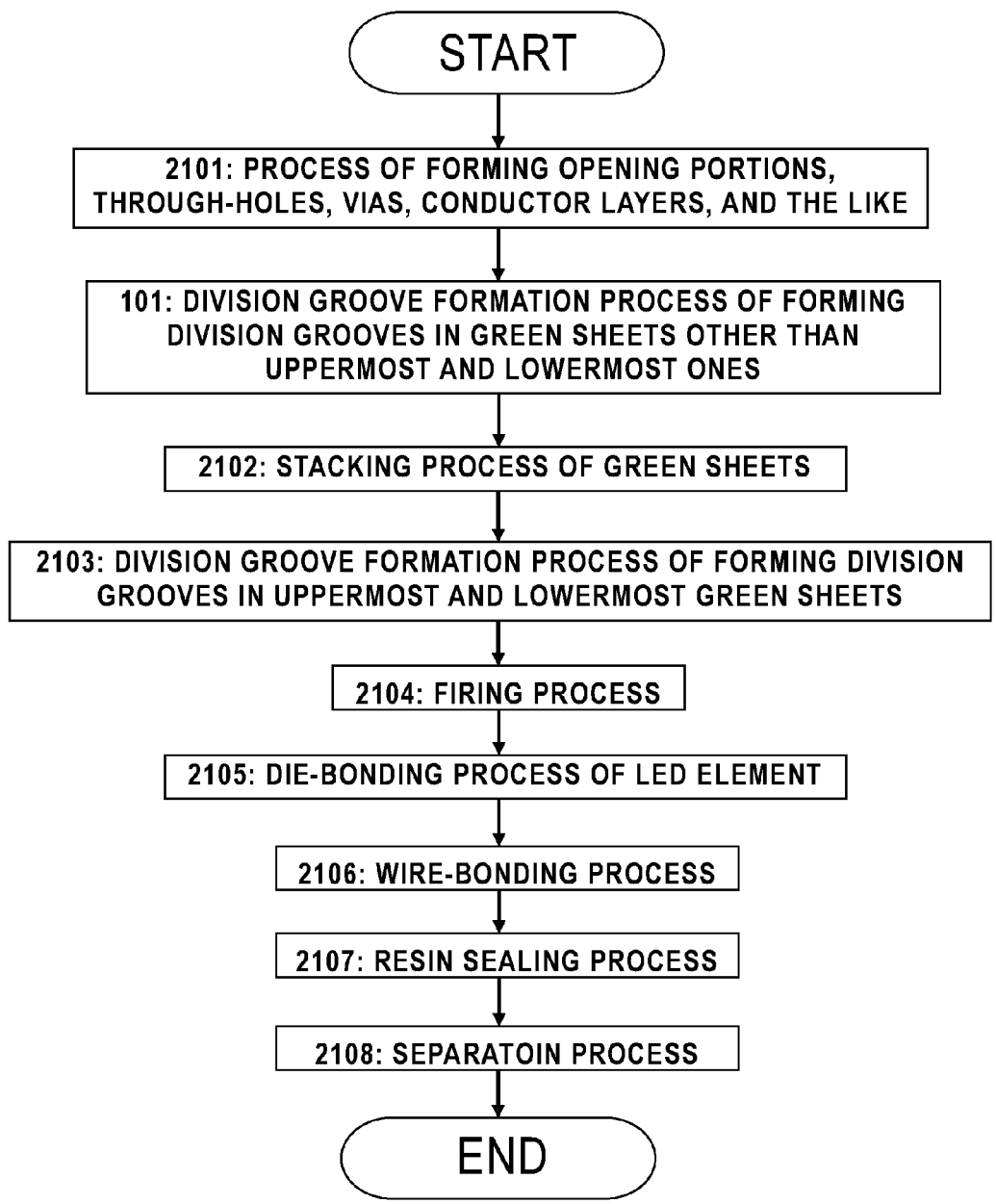

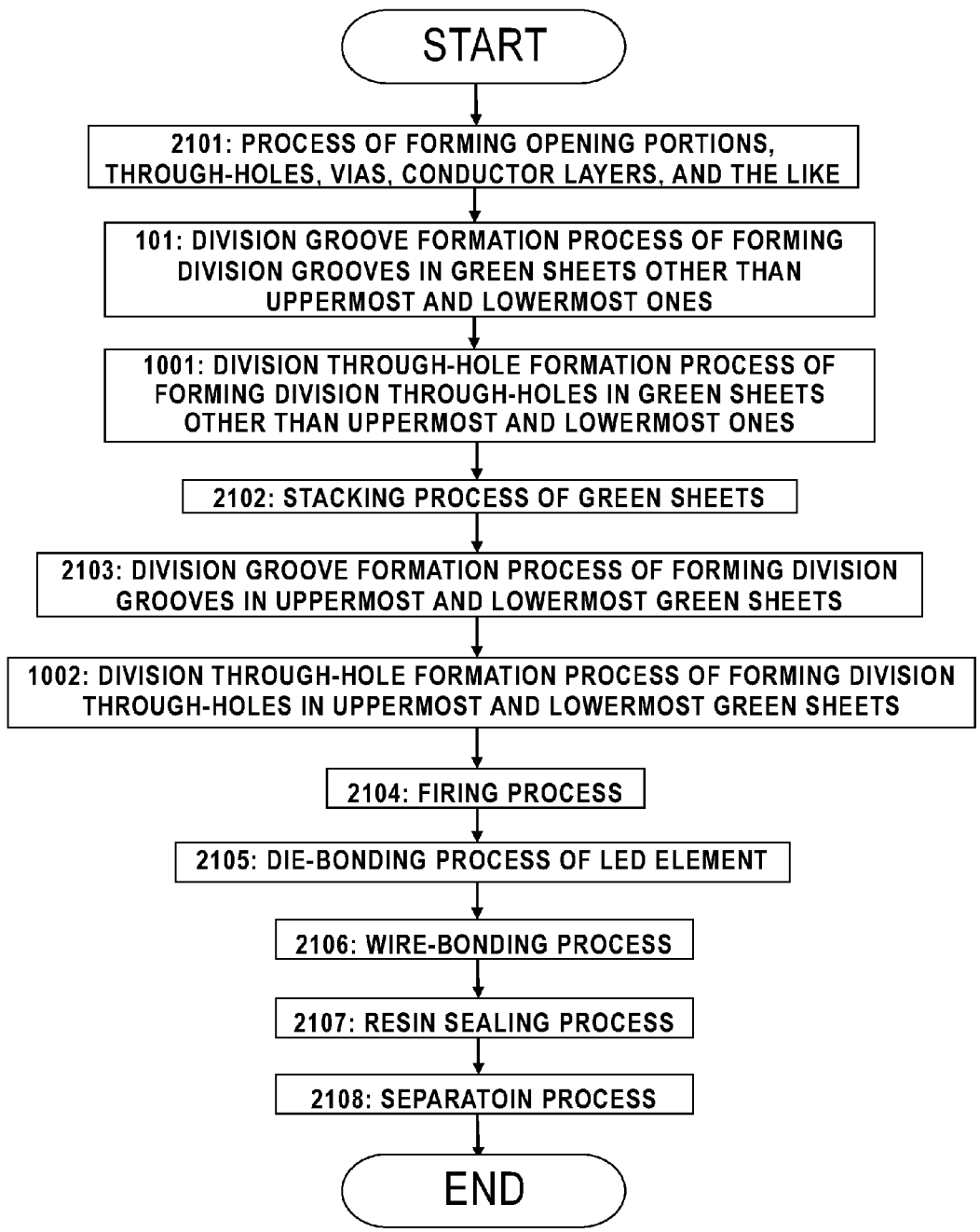

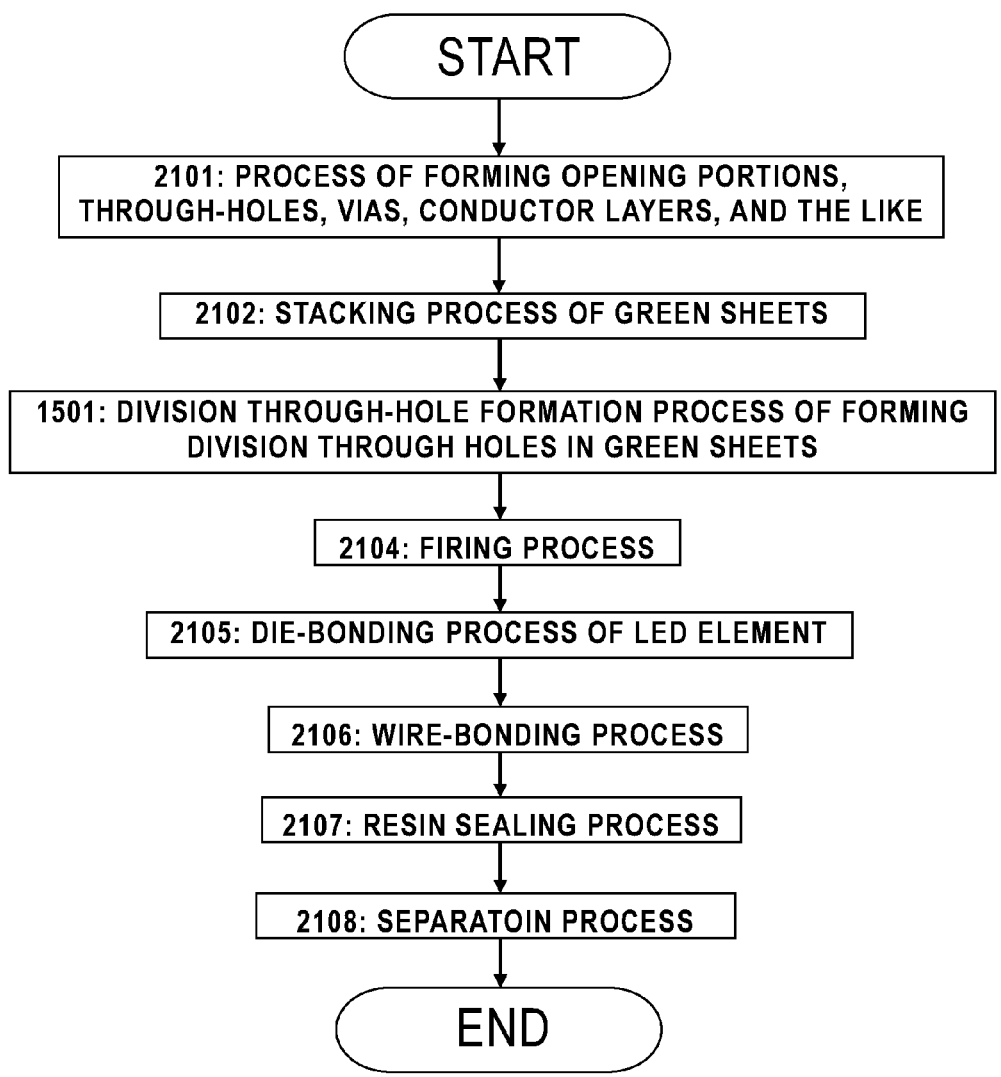

METHOD FOR MANUFACTURING CERAMIC MULTI-LAYERED INTERCONNECTION SUBSTRATE

This application claims the priority benefit under 35 U.S.C. §119 of Japanese Patent Application No. 2010-228468 filed on Oct. 8, 2010, which is hereby incorporated in its entirety by reference.

TECHNICAL FIELD

The presently disclosed subject matter relates to a method for manufacturing a ceramic multi-layered interconnection substrate.

BACKGROUND ART

Low-temperature co-fired ceramics (LTCC) have been developed recently, which are prepared by firing a conductive layer(s) and a glass ceramic simultaneously. In general, such a conductive layer is made of silver (Ag), copper (Cu), or the like, of which melting points are 962° C. and 1085° C., respectively. Even with this configuration, the glass ceramics prepared by adding a glass component to a dielectric ceramic may be fired at around 900° C., which is lower than the melting points of silver and copper. Therefore, the conductor and the glass ceramics can be fired simultaneously.

The LTCC can be manufactured by the following processes. Namely, a slurry is first prepared by mixing a raw material powder including a dielectric ceramic, glass, and the like sintering agent, an organic binder, a plasticizer, and a solvent. Then the slurry is shaped into a flexible green sheet using a doctor blade molding machine. If required, through-holes can be formed in the green sheet. A conductive paste containing silver, copper, or the like is applied to surfaces in the through-holes and surfaces of the green sheet by a printing process such as screen printing. Finally, a plurality of the resulting green sheets are pressured to be stacked, and then fired at about 900° C.

FIG. 1 is a cross-sectional view showing a low-profile package for a light emitting diode (LED) to which a method for manufacturing LTCCs as described above.

In FIG. 1, glass ceramic layers 1, 2, 3, 4, 5, 6, and 7 are stacked to form a single assembled substrate (or collective substrate). In particular, depending on the action and the position of stacking, the glass ceramic layers 1 and 2 can serve as a reflector layer, the glass ceramic layer 3 can serve as a bonding layer, the glass ceramic layers 4, 5, and 6 can serve as an inner layer, and the glass ceramic layer 7 can serve as an underlayer.

The glass ceramic layers 1 and 2 can be formed to provide a frame structure where a center opening portion is formed. If required, the inner surface of the opening portion may be plated or subject to other processing to form a high reflectance metal layer, such as of silver (not shown). The glass ceramic layers 3, 4, 5, 6, and 7 can be provided with vias 31, 41, 51, 61, and 71, for example, made of copper (Cu) and conductive layers 32, 33, 42, 52, 62, and 72, respectively.

An LED element 8 can be die-bonded on the conductive layer 33 of the glass ceramic layer 3, and can be further connected to the other conductive layer 33 via a bonding wire 9. Lastly, the LED element 8 and the bonding wire 9 can be sealed with a sealing resin layer 10.

FIG. 2 is a flow chart illustrating the method for manufacturing a conventional ceramic multi-layered interconnection substrate, which can be applied to the low-profile package for an LED element shown in FIG. 1.

First, in Step 2101, green sheets 1' and 2' (as shown in FIG. 3B) corresponding to the glass ceramic layers 1 and 2 of FIG. 1 can be processed to have respective opening portions, and if required, the inner surface of the opening portion may be electrolytically plated or subject to other processing to form a high reflectance metal layer, such as of silver (not shown). Then green sheets 3' to 7' corresponding to the glass ceramic layers 3 to 7 can be processed by laser processing to each have a respective through-hole. Vias and conductive layers can be formed on the surfaces in the through-holes and surfaces of the green sheets 3' to 7' by a printing process, such as screen printing.

Next, in Step 2102, as shown in FIG. 3B, the green sheets 1' to 7' can be pressed to be stacked. In FIG. 3B, the high reflectance metal layers of the green sheets 1' and 2' and the through-holes, the vias and the conductive layers of the green sheets 3' to 7' are not illustrated.

Then, in Step 2103, as shown in FIG. 4B, division grooves $G_1$ and $G_7$ can be formed in the uppermost green sheet 1' and the lowermost green sheet 7'. Note that FIG. 4B also does not show the high reflectance metal layers of the green sheets 1' and 2' and the through-holes, the vias and the conductive layers of the green sheets 3' to 7'.

Next, in Step 2104, the stacked green sheets 1' to 7' can be fired at about 900° C. If the conductive layers and the like are made of copper and the like, the green sheets are fired under nitrogen atmosphere to prevent the oxidation of the conductive layers and the like.

Next, in Step 2105, the LED element 8 can be die-bonded onto the conductive layer 33 of the glass ceramic layer 3 (see FIG. 1).

Then, in Step 2106, the LED element 8 and the conductive layer 33 can be connected by a bonding wire 9 (see FIG. 1).

Next, in Step 2107, if desired, the LED element 8 and the bonding wire 9 can be sealed by a sealing resin layer 10 (see FIG. 1).

Lastly, in Step 2108, the stacked ceramic layers can be pressed from the glass ceramic layer 1 side to be broken along the division grooves $G_1$ and $G_7$, so that the respective low-profile packages for an LED element can be separated individually. As a result, the low-profile package for an LED composed of the glass ceramic layers 1 to 7 as shown in FIGS. 5A and 5B can be obtained. In this case, the uppermost glass ceramic layer 1 and the lowermost glass ceramic layer 7 can be observed to have portions $G_1'$ and $G_7'$ which have been formed from the division grooves $G_1$ and $G_7$. In FIGS. 5A and 5B, the high reflectance metal layers of the glass ceramic layers 1 and 2 and the through-holes, the vias, the conductive layers, the LED element 8, the bonding wires 9, and the sealing resin layer 10 of the glass ceramic layers 3 to 7 are not illustrated.

Japanese Patent Application Laid-Open No. 2003-249755 describes a conventional technology in which the division grooves are formed in the uppermost layer and lowermost layer of a ceramic multi-layered interconnection substrate. Japanese Patent Application Laid-Open No. 2008-28065 describes another conventional technology in which division grooves are formed in the upper and lower surfaces of a ceramic interconnection substrate.

However, the conventional methods for manufacturing ceramic multi-layered interconnection substrates may result in lowering the manufacturing yield, leading to manufacturing cost increases.

Specifically, when the low-profile packages for an LED are separated, appropriate breakage sometimes occurs along the predetermined breaking line, for example, shown by the dotted line $X_1$ in FIG. 6 that is substantially vertically directed from the division groove $G_1$ as the start point to the division groove $G_7$ as the end point. However, the position and size of the grain aggregate of the ceramic are not constant and the breakage in the glass ceramic layers 1 to 7 may become inclined as the breakage process proceeds. Accordingly, inappropriate breakage may occur along a breaking line shown by the dotted line $X_2$ in FIG. 6 that is obliquely directed from the division groove $G_1$ as the start point to the deviated point from the division groove $G_7$ as the end point. In this case, the deviated breakage may generate burrs Y or chips Z, resulting in lowering the manufacturing yield.

SUMMARY

The presently disclosed subject matter was devised in view of these and other problems and features and in association with the conventional art. According to an aspect of the presently disclosed subject matter, a method for manufacturing a ceramic multi-layered interconnection substrate can include a stacking step of stacking at least three green sheets, a division groove formation step of forming division grooves in an uppermost green sheet, at least one intermediate green sheet, and a lowermost green sheet among the at least three green sheets, a firing step of firing the stacked green sheets having been provided with the division grooves to form a plurality of ceramic layers, and a separation step of breaking the plurality of ceramic layers using the division grooves to separate individual ceramic multi-layered interconnection substrates (or packages).

The division groove formation step can form the respective division grooves so that widths of the division grooves are increased or decreased sequentially from the uppermost green sheet, the intermediate green sheet, and the lowermost green sheet in this order. Alternatively, the division groove formation step can form the respective division grooves so that depths of the division grooves are increased or decreased sequentially from the uppermost green sheet, the intermediate green sheet, and the lowermost green sheet in this order. Further, before the firing step, the method can include a division through-hole formation step of forming a division through-hole for use in dividing in at least one of the at least three green sheets, and the separation step can include breaking the plurality of ceramic layers using the division grooves as well as the division through-hole.

In the above configuration, the division through-hole can be formed to be aligned with the division grooves. Furthermore, a plurality of the division through-holes can be provided in line with the division grooves.

According to another aspect of the presently disclosed subject matter, another method for manufacturing a ceramic multi-layered interconnection substrate can include a stacking step of stacking at least three green sheets, a division through-hole formation step of forming a division through-hole for use in dividing in at least one green sheet among the at least three green sheets, a firing step of firing the stacked green sheets having been provided with the division through-hole to form a plurality of ceramic layers, and a separation step of breaking the plurality of ceramic layers using the division through-hole to separate individual ceramic multi-layered interconnection substrates (or packages).

In the above configuration, the through-hole can be formed to be a plurality of the division through-holes that are provided in line for separation.

According to the presently disclosed subject matter, when breaking the ceramic layers for separation, the breaking line can be ensured to be straight in a particular direction, whereby any defectives due to burrs or chips can be prevented, resulting in improving the manufacturing yield. Furthermore, the manufacturing cost can be reduced.

BRIEF DESCRIPTION OF DRAWINGS

These and other characteristics, features, and advantages of the presently disclosed subject matter will become clear from the following description with reference to the accompanying drawings, wherein:

FIG. 2 is a flow chart illustrating a method for manufacturing a conventional ceramic multi-layered interconnection substrate;

FIG. 7 is a flow chart illustrating a method for manufacturing a ceramic multi-layered interconnection substrate as a first exemplary embodiment made in accordance with principles of the presently disclosed subject matter;

FIG. 16 is a flow chart illustrating a method for manufacturing a ceramic multi-layered interconnection substrate as a second exemplary embodiment made in accordance with principles of the presently disclosed subject matter;

FIG. 21 is a flow chart illustrating a method for manufacturing a ceramic multi-layered interconnection substrate according to a third exemplary embodiment made in accordance with principles of the presently disclosed subject matter;

DESCRIPTION OF EXEMPLARY EMBODIMENTS

A description will now be made below to a method for manufacturing a ceramic multi-layered interconnection substrate of the presently disclosed subject matter with reference to the accompanying drawings and in accordance with exemplary embodiments.

Figure 1:
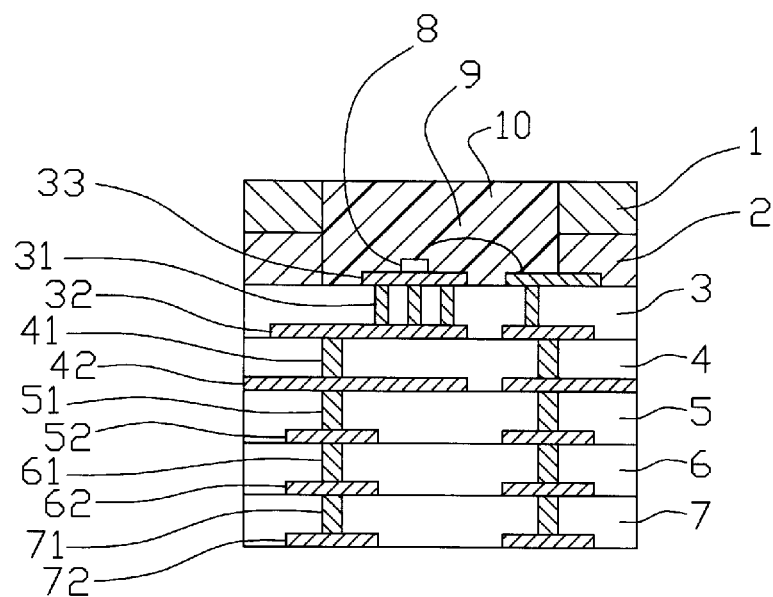
FIG. 1 is a cross-sectional view showing a low-profile package for an LED.
Figure 3A:
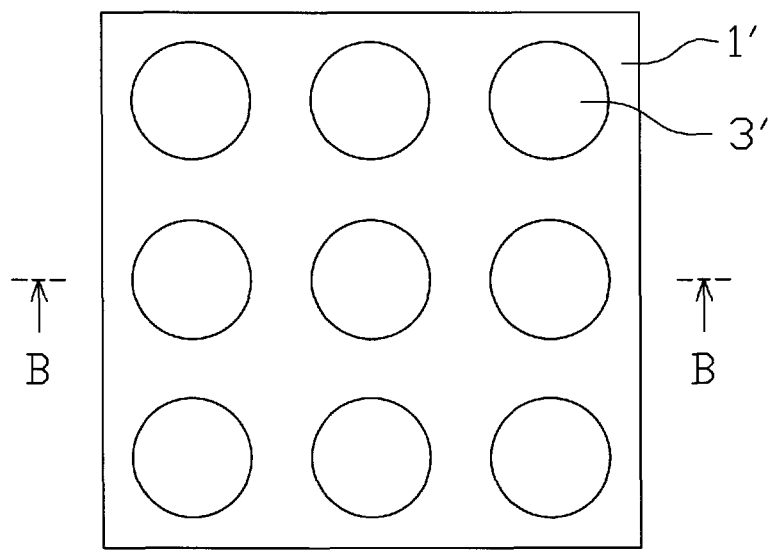
FIGS. 3A and 3B are a plan view of the substrate shown in FIG. 2 and a cross-sectional view of the same, respectively, illustrating the stacking process according to the method shown in FIG. 2.
Figure 3B:
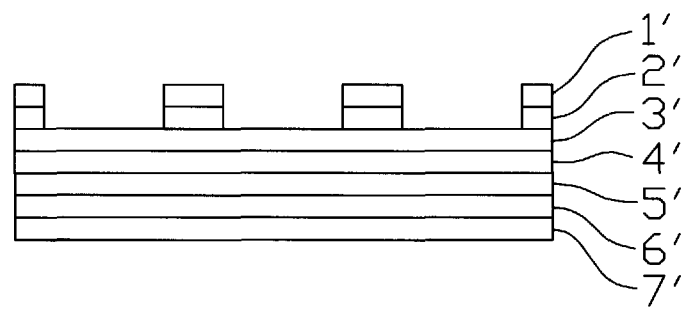
Figure 4A:
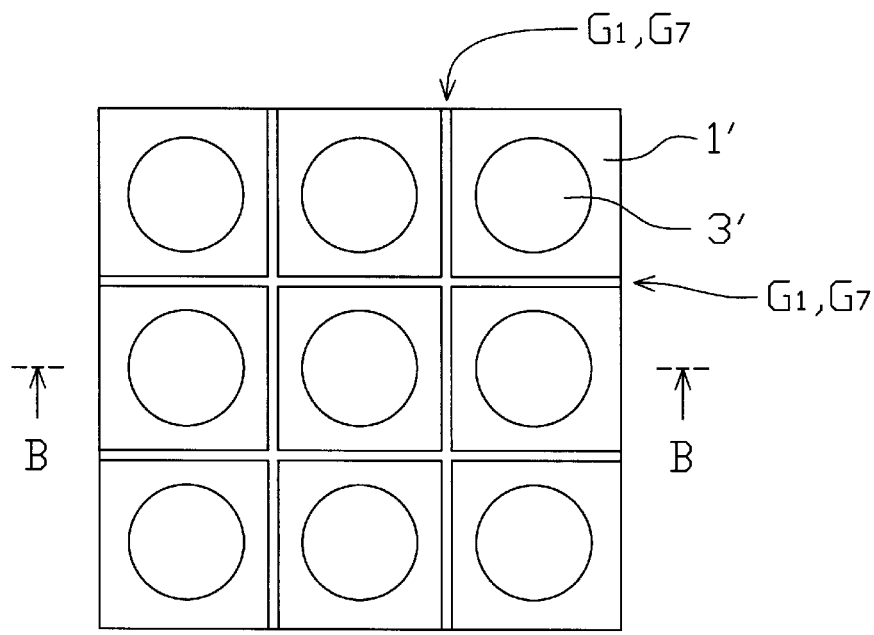
FIGS. 4A and 4B are a plan view of the substrate shown in FIG. 2 and a cross-sectional view of the same, respectively, illustrating the groove formation process according to the method shown in FIG. 2.
Figure 4B:
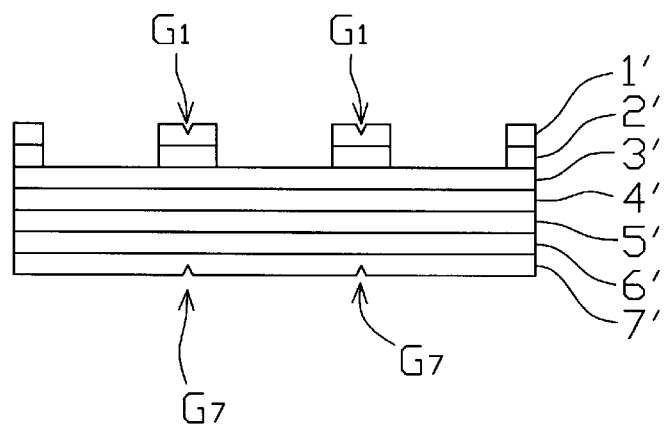
Figure 5A:
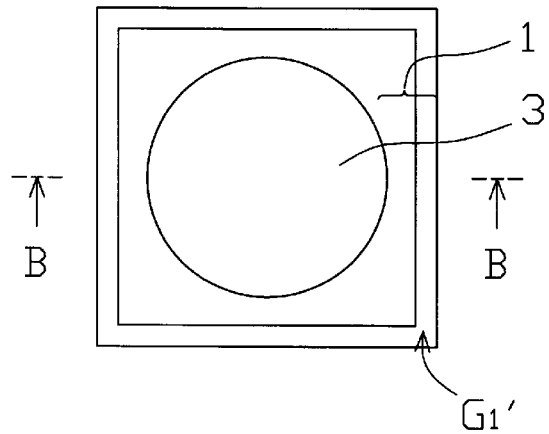
FIGS. 5A and 5B are a plan view of the substrate shown in FIG. 2 and a cross-sectional view of the same, respectively, illustrating the separation process according to the method shown in FIG. 2.
Figure 5B:
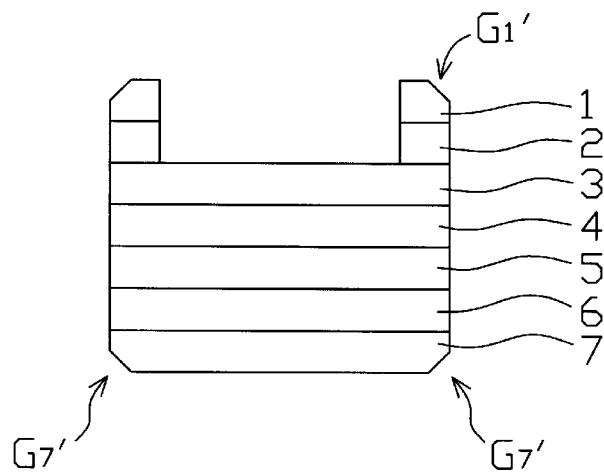
Figure 6:
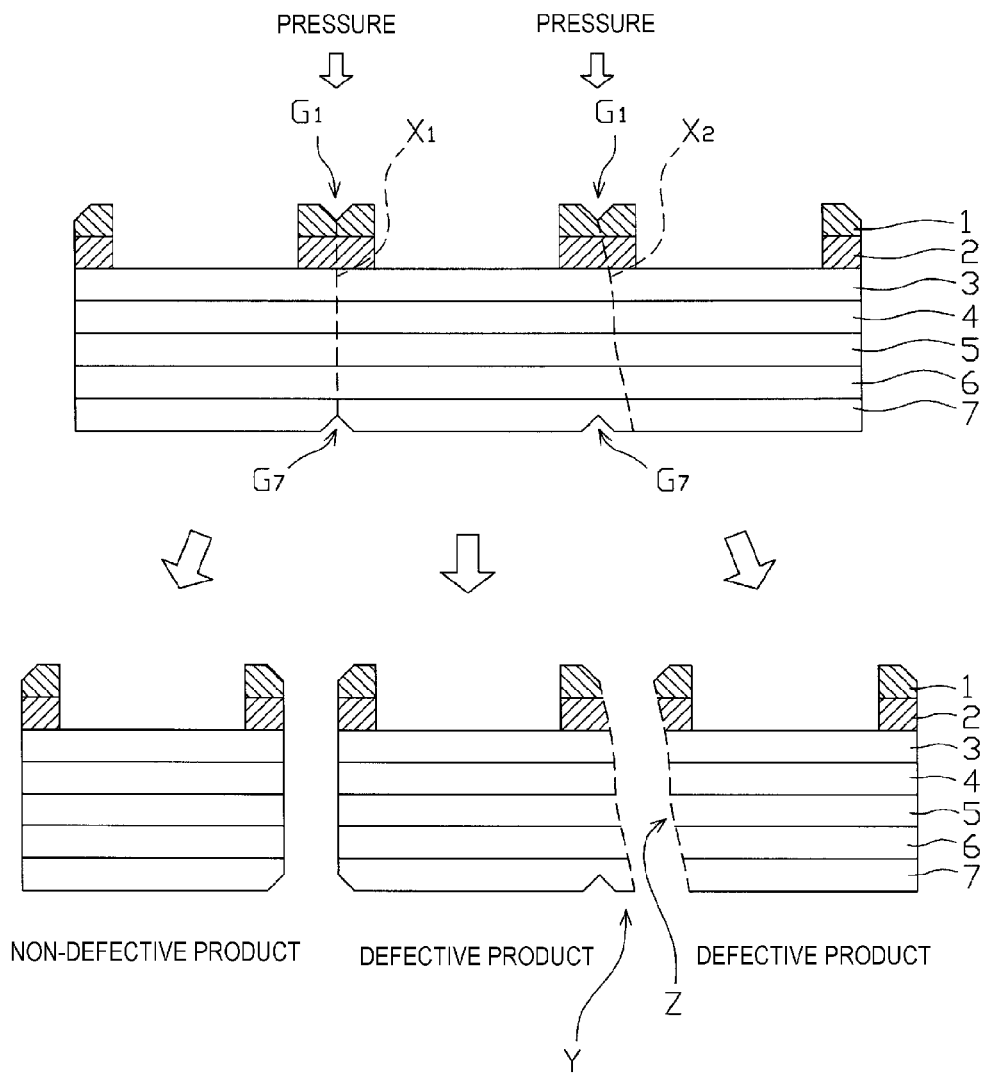
FIG. 6 is a cross-sectional view illustrating problems in a conventional method for manufacturing a ceramic interconnection substrate.

FIG. 7 is a flow chart illustrating a method for manufacturing a ceramic multi-layered interconnection substrate as a first exemplary embodiment made in accordance with principles of the presently disclosed subject matter. The method can be applied to the manufacture of the low-profile package for an LED as shown in FIG. 1. The method for manufacturing a ceramic multi-layered interconnection substrate of the first exemplary embodiment as shown in the flow chart of FIG. 7 can further include Step 101 between Step 2101 and Step 2102 in addition to the steps of the flow chart of FIG. 2.

Accordingly, in Step 2101, green sheets 1' and 2' can be processed to have respective opening portions, and if desired, the inner surface of the opening portion may be electrolytically plated or subject to other processing to form a high reflectance metal layer, such as of silver. Then green sheets 3' to 7' can be processed by laser processing or the like to each have a respective through-hole. Vias and conductive layers can be formed on the surfaces in the through-holes and surfaces of the green sheets 3' to 7' by a printing process, such as screen printing. Then, in Step 101, division grooves $G_2$ to $G_6$ can be formed in respective green sheets 2' to 6' other than the uppermost green sheet 1' and the lowermost green sheet 7' at the boundary between the adjacent packages.

Figure 8A:
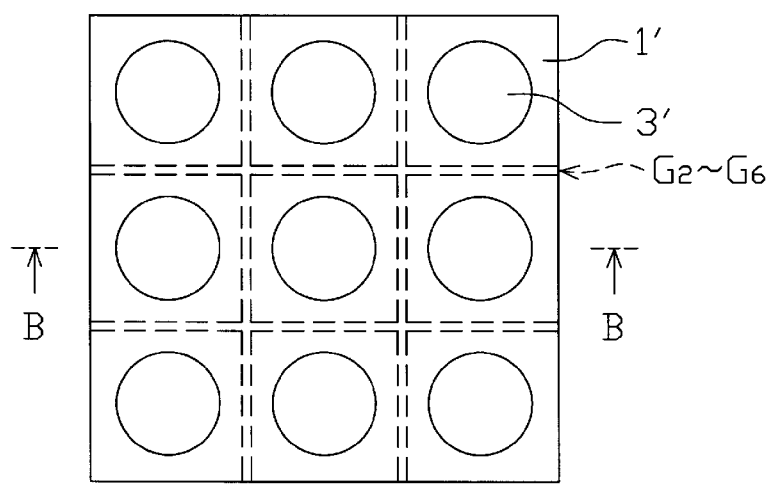
FIGS. 8A and 8B are a plan view of the substrate described in FIG. 7 and a cross-sectional view of the same, respectively, illustrating a stacking process according to the method shown in FIG. 7.
Figure 8B:
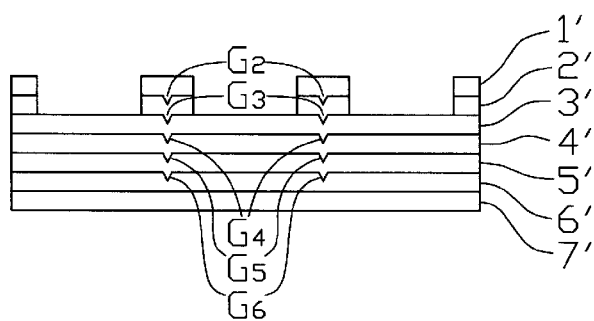
Figure 9A:
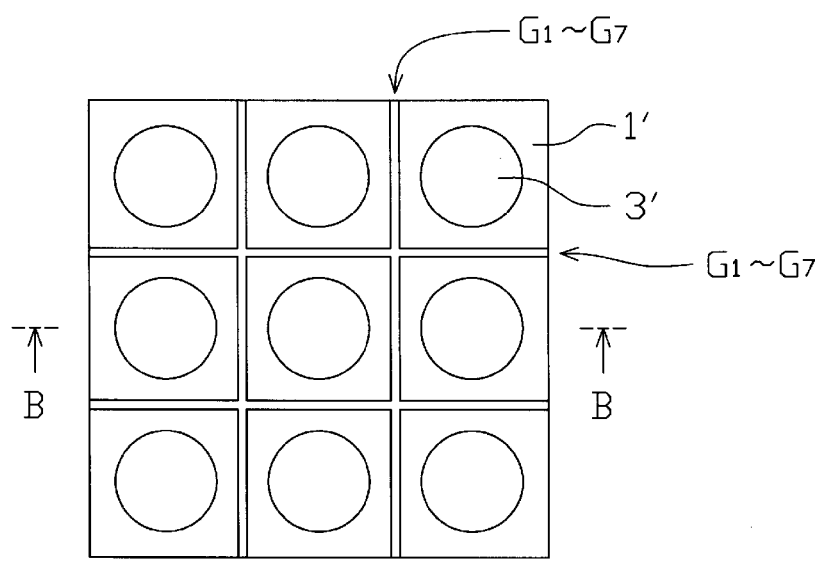
FIGS. 9A and 9B are a plan view of the substrate described in FIG. 7 and a cross-sectional view of the same, respectively, illustrating a groove formation process of forming grooves for use in division in the uppermost and lowermost green sheets according to the method shown in FIG. 7.
Figure 9B:
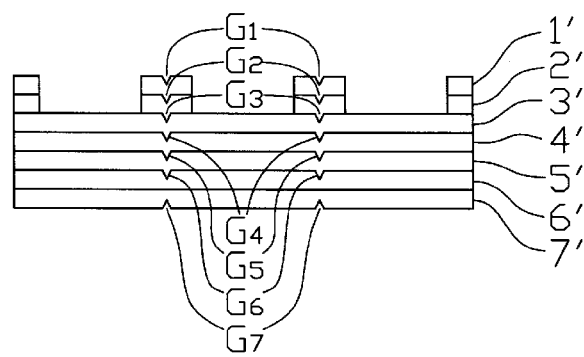

Next, in Step 2102, as shown in FIG. 8B, the green sheets 1' to 7' can be pressed to stacked. Then, in Step 2103, as shown in FIG. 9B, division grooves $G_1$ and $G_7$ can be formed in the uppermost green sheet 1' and the lowermost green sheet 7'.

Next, in Step 2104, the stacked green sheets 1' to 7' can be fired at about 900° C. Next, in Step 2105, an LED element 8 can be die-bonded onto the conductive layer 33 of the glass ceramic layer 3. Then, in Step 2106, the LED element 8 and the conductive layer 33 can be connected by a bonding wire 9. Next, in Step 2107, if desired, the LED element 8 and the bonding wire 9 can be sealed by a sealing resin layer 10.

Figure 10A:
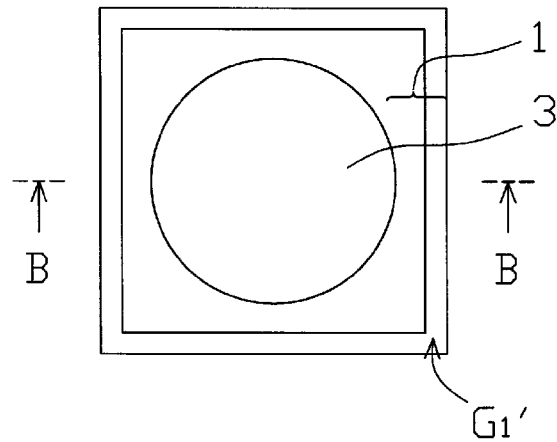
FIGS. 10A and 10B are a plan view of the substrate described in FIG. 7 and a cross-sectional view of the same, respectively, illustrating a separation process according to the method described in FIG. 7.
Figure 10B:
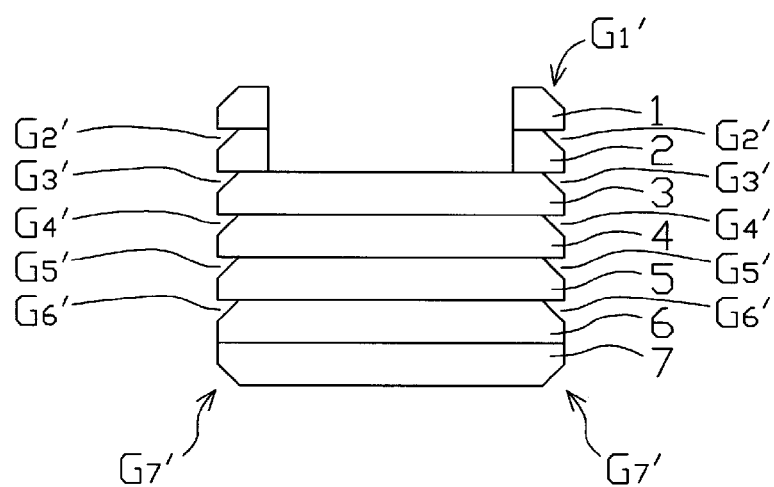

Lastly, in Step 2108, the stacked ceramic layers can be pressed from the glass ceramic layer 1 side to be broken along the division grooves $G_1$ to $G_7$, so that the respective low-profile packages for an LED can be separated individually. As a result, the low-profile package for an LED composed of the glass ceramic layers 1 to 7 as shown in FIGS. 10A and 10B can be obtained. In this case, the glass ceramic layers 1 to 7 can be observed to have portions $G_1'$ to $G_7'$ which have been formed from the division grooves $G_1$ to $G_7$.

Figure 11:
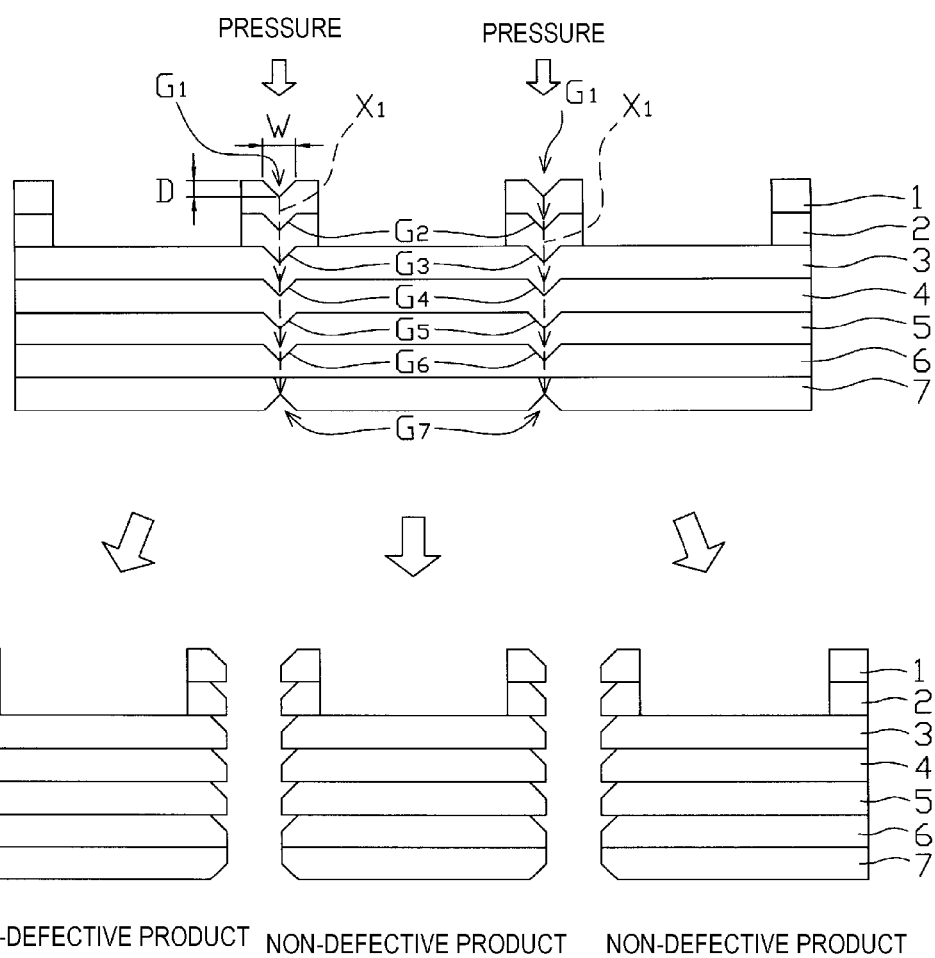
FIG. 11 is a cross-sectional view illustrating the separation process shown in FIGS. 10A and 10B in detail.

More specifically, when the stacked glass ceramic layers 1 to 7 are pressed from the glass ceramic layer 1 side, appropriate breakage can be consistently achieved along the breaking line shown by the dotted line $X_1$ in FIG. 11. In this case, even when the breakage starting from the division groove $G_1$ as the start point obliquely occurs to reach the division groove $G_2$, the inclined breakage can be stopped and breakage can start again from the division groove $G_2$. In the same manner, even if the inclined breakage occurs at mid-point, the same effect can be achieved to be directed to the next division groove $G_3$ to $G_6$ till reaching the last division groove $G_7$. Accordingly, even if the position and size of the grain aggregate of the ceramic are not constant, and even if the breakage proceeds slightly obliquely, any defectives due to burrs or chips can be prevented, resulting in improving the manufacturing yield. Furthermore, according to the first exemplary embodiment, the manufacturing cost can be reduced due to the increased manufacturing yield. Simultaneously, since the pressure to be applied to the glass ceramic layers during the separation process can be decreased, the stress applied to the glass ceramic layers can be reduced, and the wear and noise of a separation machine for breaking the ceramic layers can be decreased.

It should be appreciated that the cross-section (shape) of the division grooves $G_1$ to $G_7$ can take any cross-section (shape) as long as the advantageous effects of the presently disclosed subject matter can be achieved, and examples thereof include a V-letter cross-section, a U-letter cross-section, and the like. An exemplary width W of the division grooves $G_1$ to $G_7$ may be 5 µm to 30 µm when the thickness T of the green sheet 1 to 7 is 100 µm to 300 µm, and an exemplary depth D of the division grooves $G_1$ to $G_7$ may be 30 µm to 150 µm (30 to 50% of T).

Figure 12:
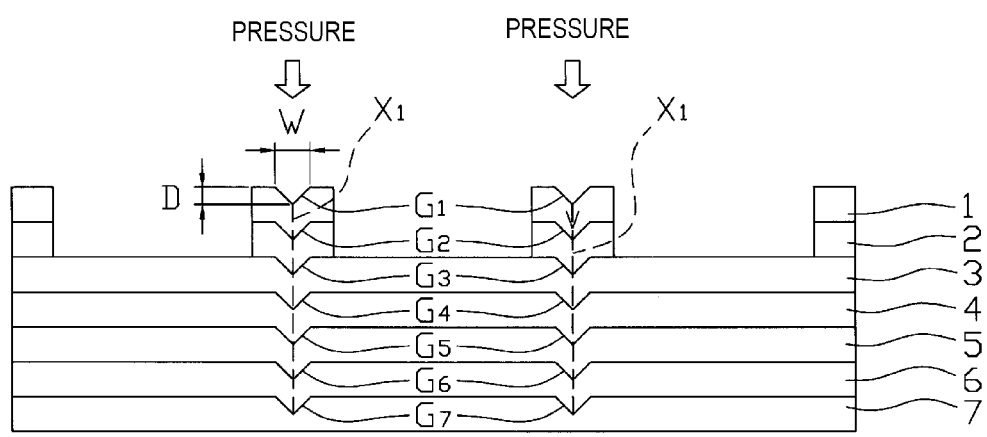
FIG. 12 is a cross-sectional view showing a first modified example of the separation process and structure as shown in FIG. 11.

In the first exemplary embodiment as described above, after Step 2103 of the stacking process, the division grooves $G_1$ and $G_7$ are formed in the uppermost and the lowermost green sheets 1' and 7' at the package boundaries. However, the presently disclosed subject matter is not limited to this particular configuration. The division grooves $G_1$ and $G_7$ can be formed at the same time when the division grooves $G_2$ to $G_6$ are formed in the green sheets 2' to 6' at the respective package boundaries in the Step 101 before the stacking process. In this case, as shown in FIG. 12 showing a first modified example of that shown in FIG. 11, the division grooves $G_1$ to $G_7$ can be formed to be directed in the same single direction.

Figure 13:
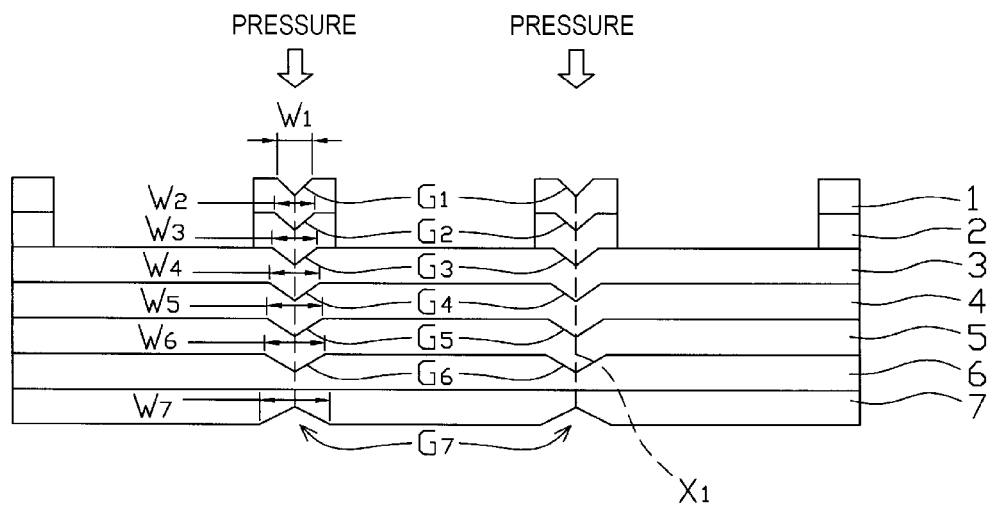
FIG. 13 is a cross-sectional view showing a second modified example of the separation process and structure as shown in FIG. 11.

FIG. 13 is a cross-sectional view showing a second modified example of that shown in FIG. 11. In some cases, the breakage in the glass ceramic layers 1 to 7 may still be likely to be inclined as the breakage proceeds. As shown in FIG. 13, in order to facilitate the continuation of the breakage line from one division groove to the adjacent next division groove, the width $W_1$ to $W_7$ of the division groove $G_1$ to $G_7$ can be increased along the direction where the breakage proceeds. Namely, the following inequality holds;

$$W_1 \leq W_2 \leq W_3 \leq W_4 \leq W_5 \leq W_6 \leq W_7.$$

Figure 14:
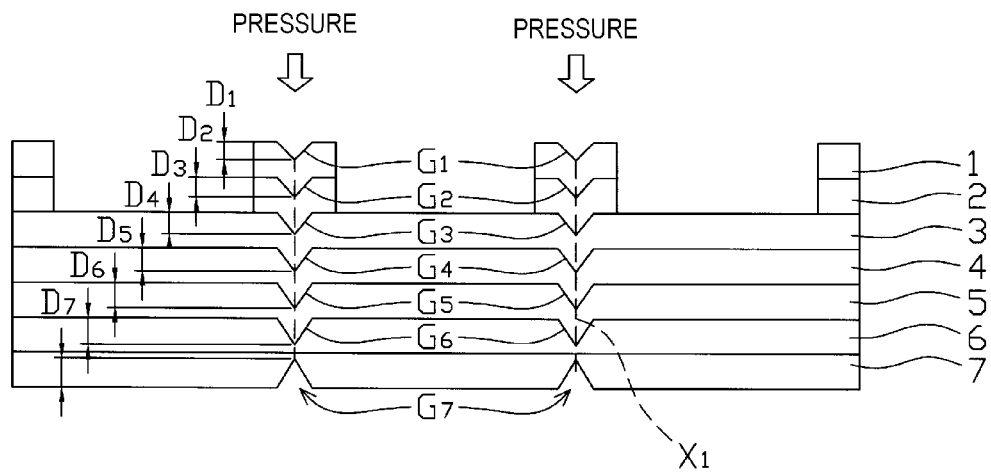
FIG. 14 is a cross-sectional view showing a third modified example of the separation process and structure as shown in FIG. 11.

FIG. 14 is a cross-sectional view showing a third modified example of that shown in FIG. 11. In this modified example, the depth $D_1$ to $D_7$ of the division groove $G_1$ to $G_7$ can be increased along the direction where the breakage proceeds. Namely, the following inequality holds:

$$D_1 \leq D_2 \leq D_3 \leq D_4 \leq D_5 \leq D_6 \leq D_7.$$

Alternatively, when the breakage direction is started from the glass ceramic layer 7 to the glass ceramic layer 1, the above inequalities can be:

$$W_1 \geq W_2 \geq W_3 \geq W_4 \geq W_5 \geq W_6 \geq W_7, \text{ and}$$

$$D_1 \geq D_2 \geq D_3 \geq D_4 \geq D_5 \geq D_6 \geq D_7.$$

Further, it should be noted that both the width and depth can be simultaneously changed, namely, increased or decreased along the direction as the breakage proceeds.

In the above exemplary embodiment and the modified examples thereof as shown in FIGS. 11, 12, 13, and 14, the division groove is provided to every glass ceramic layer 1 to 7, however, the disclosed subject matter should not be limited to only this feature. For example, the division groove can be provided to at least the uppermost glass ceramic layer 1, the lowermost glass ceramic layer 7, and at least one of the intermediate glass ceramic layers 2 to 6. In this case, the same advantageous effects such as an increase in manufacturing yield can be achieved.

Figure 15A:
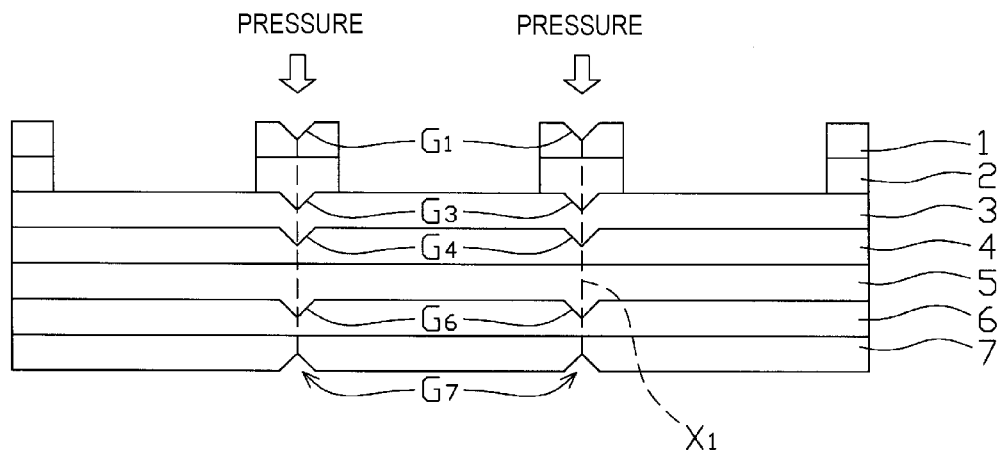
FIGS. 15A and 15B each are a cross-sectional view showing a fourth modified example of the separation process and structure as shown in FIG. 11.
Figure 15B:
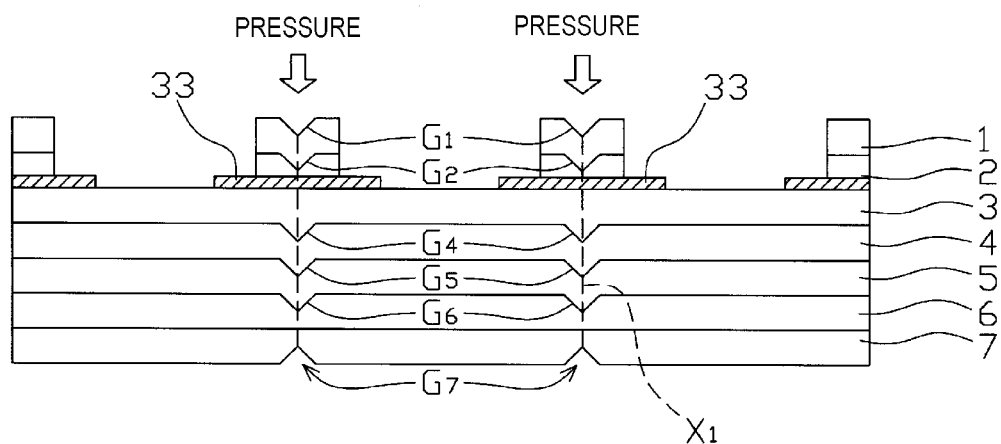

FIG. 15A is a cross-sectional view showing a fourth modified example of that shown in FIG. 11, and the division grooves $G_1$, $G_3$, $G_4$, $G_6$ and $G_7$ can be provided to the glass ceramic layers 1, 3, 4, 6, and 7, respectively. Another mode of the fourth modified example is shown in FIG. 15B. If a pattern of a conductive layer 33 is formed at a position to be divided in the glass ceramic layer 3 (or bonding layer), and if the pattern of the conductive layer 33 is to be connected to the adjacent packages in order to perform electroplating process after firing, then a division groove should not be formed in the pattern of the conductive layer 33 of the glass ceramic layer 3.

FIG. 16 is a flow chart illustrating a method for manufacturing a ceramic multi-layered interconnection substrate as a second exemplary embodiment made in accordance with principles of the presently disclosed subject matter. The method can be applied to the manufacture of the low-profile package for an LED as shown in FIG. 1. The method for manufacturing a ceramic multi-layered interconnection substrate of the second exemplary embodiment as described in the flow chart of FIG. 16 can further include Step 1001 after Step 101 of FIG. 7 and Step 1002 after Step 2103 in addition to the steps of the flow chart of FIG. 7.

Accordingly, in Step 2101, green sheets 1' and 2' can be processed to have respective opening portions, and if desired, the inner surface of the opening portion may be electrolytically plated or subject to other processing to form a high reflectance metal layer, such as of silver. Then green sheets 3' to 7' can be processed by laser processing or the like to have required through-holes, respectively. Vias and conductive layers can be formed on the surfaces in the through-holes and surfaces of the green sheets 3' to 7' by printing such as screen printing. Then, in Step 101, division grooves $G_2$ to $G_6$ can be formed in the respective green sheets 2' to 6' other than the uppermost green sheet 1' and the lowermost green sheet 7' at the boundary between the adjacent packages. Next, in Step 1001, division through-holes $TH_2$ to $TH_6$ can be formed in the green sheets 2' to 6' other than the uppermost green sheet 1' and the lowermost green sheet 7' by laser processing or the like at the boundary between the adjacent packages. It should be noted that the division through-holes $TH_2$ to $TH_6$ can be formed simultaneously at the time when the through-holes are formed in the green sheets 2' to 6' in Step 2101.

Figure 17A:
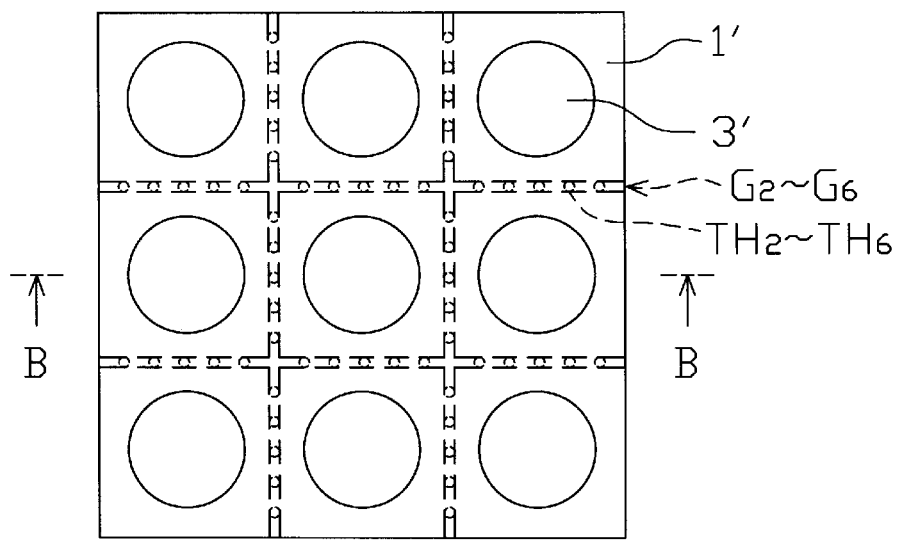
FIGS. 17A and 17B are a plan view of the substrate described in FIG. 16 and a cross-sectional view of the same, respectively, illustrating a stacking process according to the method described in FIG. 16.
Figure 17B:
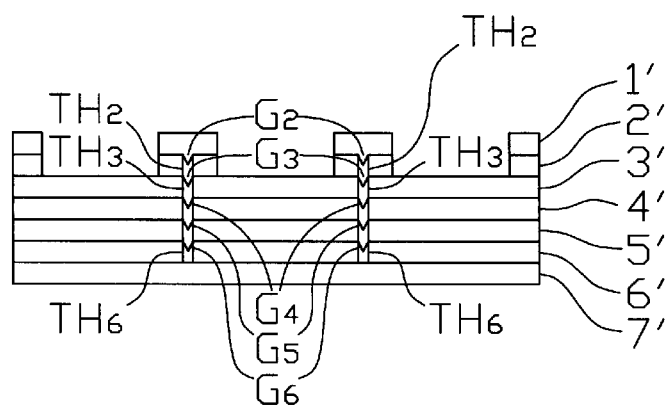
Figure 18A:
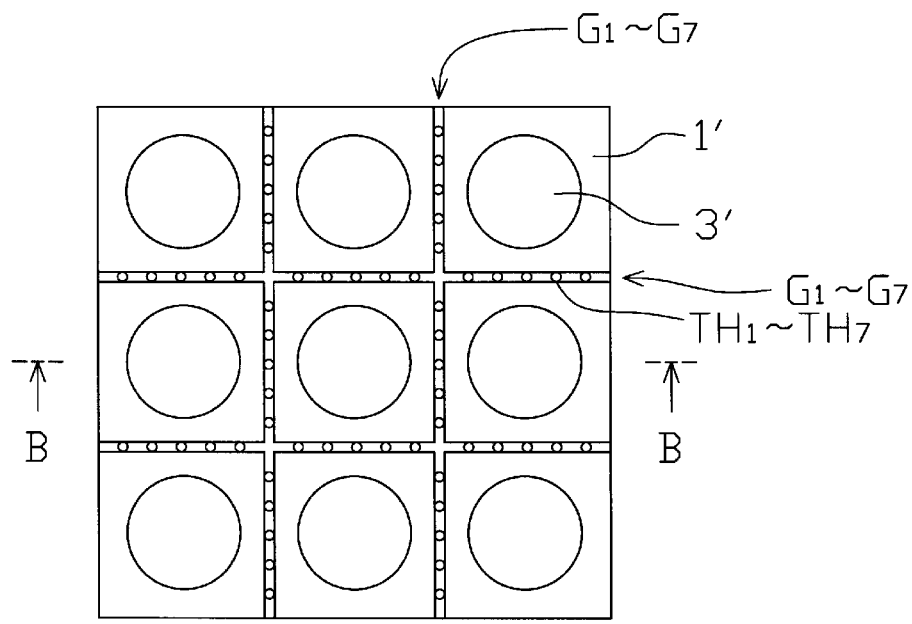
FIGS. 18A and 18B are a plan view of the substrate described in FIG. 16 and a cross-sectional view of the same, respectively, illustrating a through-hole formation process of forming through-holes for use in division in the uppermost and lowermost green sheets according to the method described in FIG. 16.
Figure 18B:
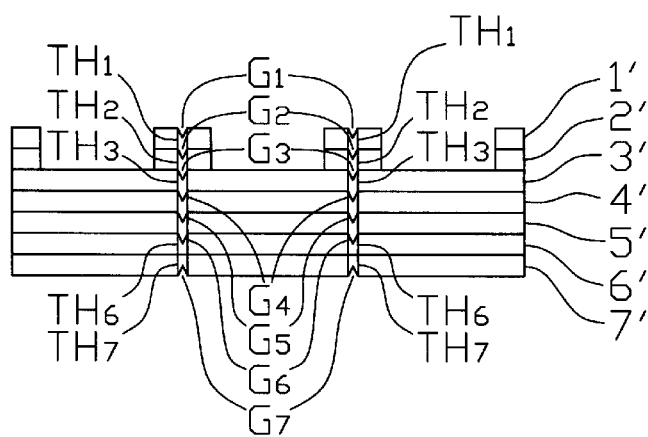
Figure 19A:
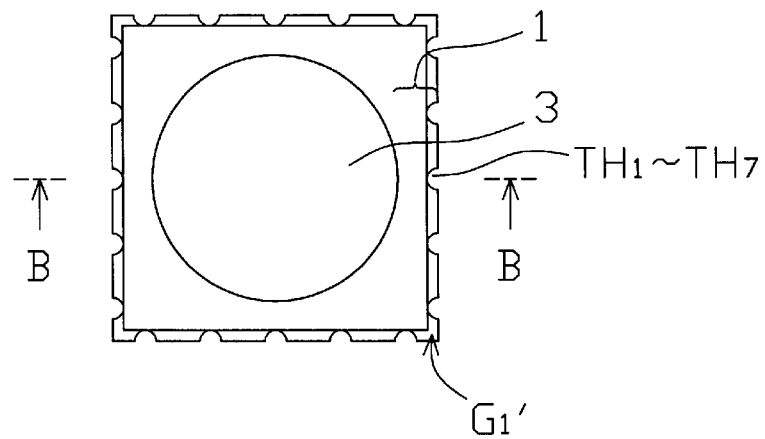
FIGS. 19A and 19B are a plan view of the substrate described in FIG. 16 and a cross-sectional view of the same, respectively, illustrating a separation process according to the method described in FIG. 16.
Figure 19B:
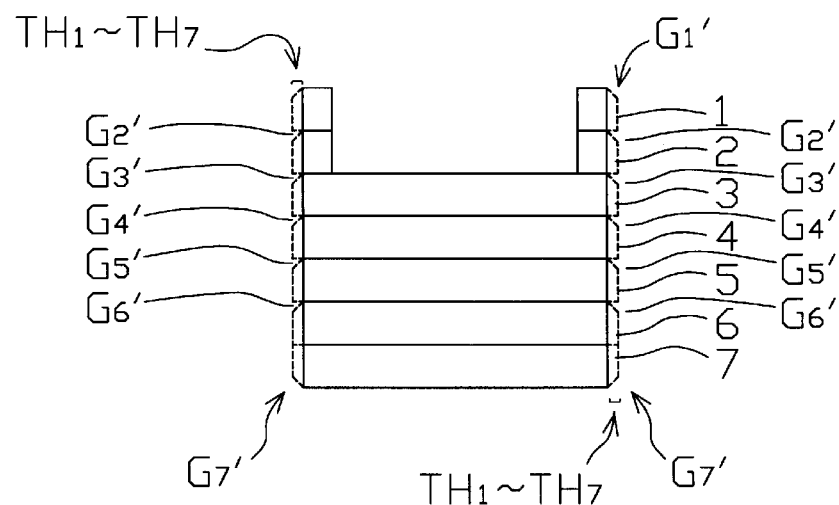

Next, in Step 2102, as shown in FIG. 17B, the green sheets 1' to 7' can be pressed to be stacked. Then, in Step 2103, as shown in FIG. 18B, division grooves $G_1$ and $G_7$ can be formed in the uppermost green sheet 1' and the lowermost green sheet 7'. Next, in Step 1002, division through-holes $TH_1$ and $TH_7$ can be formed in the uppermost green sheet 1' and the lowermost green sheet 7' by laser processing or the like at the boundary between the adjacent packages.

Next, in Step 2104, the stacked green sheets 1' to 7' can be fired at about 900° C. Next, in Step 2105, an LED element 8 can be die-bonded onto the conductive layer 33 of the glass ceramic layer 3. Then, in Step 2106, the LED element 8 and the conductive layer 33 can be connected by a bonding wire 9. Next, in Step 2107, if desired, the LED element 8 and the bonding wire 9 can be sealed by a sealing resin layer 10.

Lastly, in Step 2108, the stacked ceramic layers can be pressed from the glass ceramic layer 1 side to be broken along the division grooves $G_1$ to $G_7$ with the division through-holes $TH_1$ to $TH_7$, so that the respective low-profile packages for an LED can be separated individually. As a result, the low-profile package for an LED composed of the glass ceramic layers 1 to 7 as shown in FIGS. 13A and 13B can be obtained. In this case, the glass ceramic layers 1 to 7 can be observed to have the half portions of the division through-holes $TH_1$ and $TH_7$ as well as portions $G_1'$ to $G_7'$ which have been formed from the division grooves $G_1$ to $G_7$.

As discussed above, the second exemplary embodiment can facilitate the breakage proceeding in the vertical direction more than the first exemplary embodiment, resulting in further improved manufacturing yield and reduction of manufacturing cost. Simultaneously, since the pressure to be applied to the glass ceramic layers during the separation process can be decreased, the stress applied to the glass ceramic layers can be reduced, and the wear and noise of a separation machine for breaking the ceramic layers can be decreased.

In the first exemplary embodiment as described above, after Step 2102 of the stacking process, the division grooves $G_1$ and $G_7$ and the division through-holes $TH_1$ and $TH_7$ are formed in the uppermost and the lowermost green sheets 1' and 7' at the package boundaries. However, the presently disclosed subject matter is not limited to this particular configuration. The division through-holes $TH_1$ and $TH_7$ can be formed at the same time when the division through-holes $TH_2$ to $TH_6$ are formed in the green sheets 2' to 6' at the respective package boundaries in the Step 1001 before the stacking process.

Figure 20A:
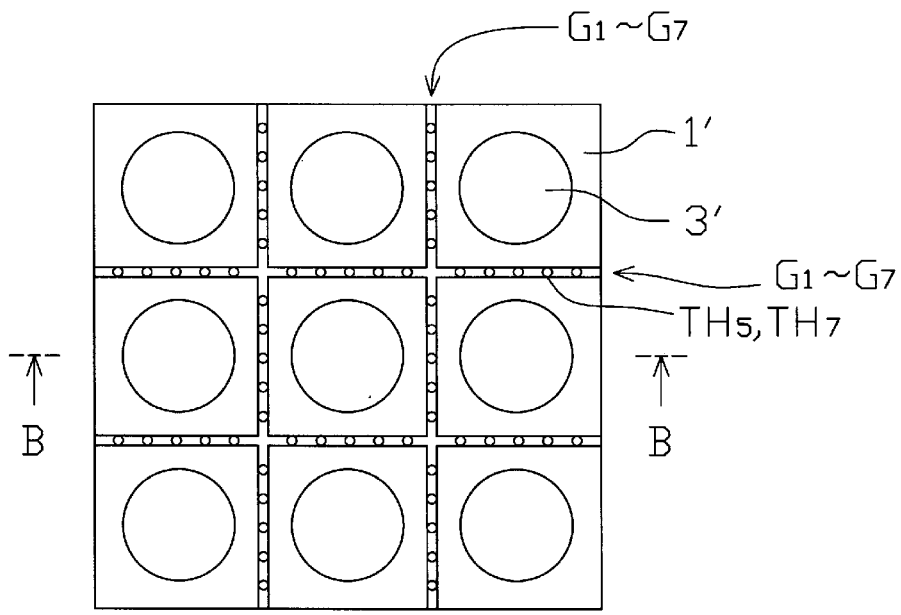
FIG. 20 is a cross-sectional view showing a first modified example of the process and structure as shown in FIGS. 18A and 18B.
Figure 20B:
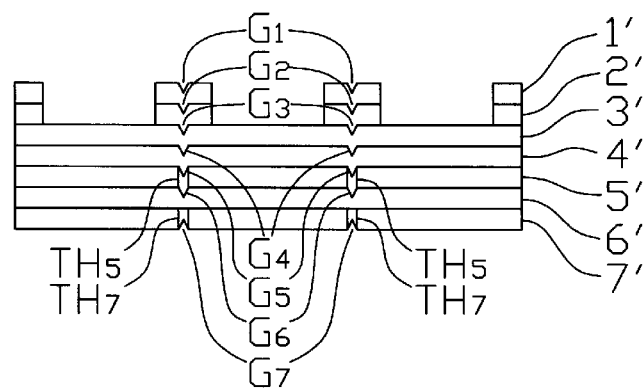

In the above exemplary embodiment as shown in FIGS. 16, 17A, 17B, 18A, 18B, 19A and 19B, the division through-hole is provided to every glass ceramic layer 1 to 7, however, the disclosed subject matter does not require that each ceramic layer 1 to 7 include a through-hole, and contemplates other different features. For example, a division through-hole may be provided to at least part of the glass ceramic layers 1 to 7. In this case, the same advantageous effects such as an increase in manufacturing yield can be achieved more than the first exemplary embodiment. FIG. 20 is a cross-sectional view showing a first modified example of that shown in FIGS. 18A and 18B, and only the division through-holes $TH_5$ and $TH_7$ can be provided to the glass ceramic layers 5, and 7, respectively.

FIG. 21 is a flow chart illustrating a method for manufacturing a ceramic multi-layered interconnection substrate as a third exemplary embodiment made in accordance with principles of the presently disclosed subject matter. The method can be applied to the manufacture of the low-profile package for an LED as shown in FIG. 1. The method for manufacturing a ceramic multi-layered interconnection substrate of the third exemplary embodiment as shown in the flow chart of FIG. 21 can further include Step 1501 of forming division through-holes after Step 2102 while Step 101 and Step 2103 of forming division grooves in FIG. 7 are eliminated.

Figure 22A:
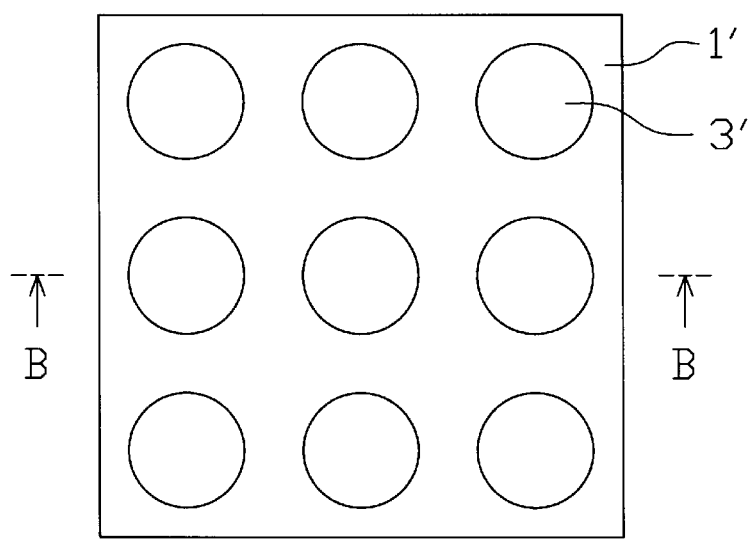
FIGS. 22A and 22B are a plan view of the substrate described in FIG. 21 and a cross-sectional view of the same, respectively, illustrating a stacking process according to the method described in FIG. 21.
Figure 22B:
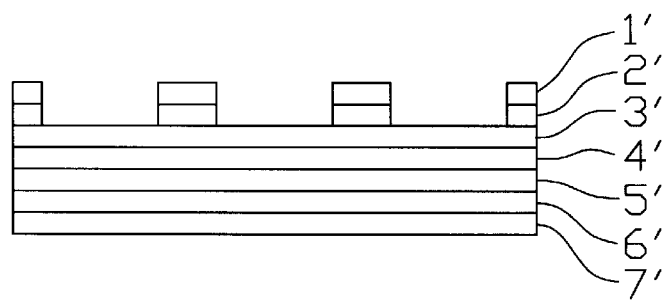
Figure 23A:
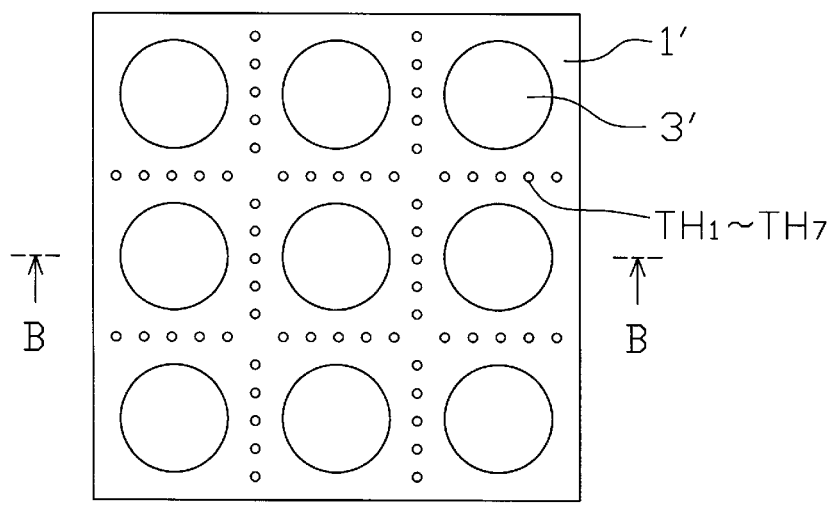
FIGS. 23A and 23B are a plan view of the substrate described in FIG. 21 and a cross-sectional view of the same, respectively, illustrating a through-hole formation process of forming through-holes for use in division in the uppermost and lowermost green sheets according to the method described in FIG. 21.
Figure 23B:
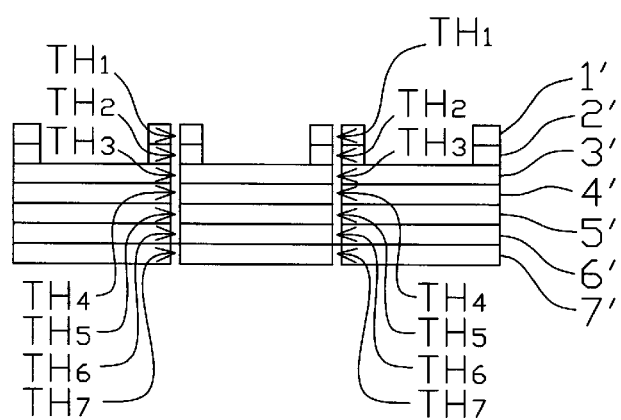

Accordingly, in Step 2101, green sheets 1' and 2' can be processed to have respective opening portions, and if desired, the inner surface of the opening portion may be electrolytically plated or subject to other processing to form a high reflectance metal layer, such as of silver. Then green sheets 3' to 7' can be processed by laser processing or the like to have through-holes, respectively. Vias and conductive layers can be formed on the surfaces in the through-holes and surfaces of the green sheets 3' to 7' by a printing process, such as screen printing. Next, in Step 2102, as shown in FIG. 22B, the green sheets 1' to 7' can be pressed to be stacked. Next, in Step 1501, as shown in FIGS. 23A and 23B, division through-holes $TH_1$ to $TH_7$ can be formed in the green sheets 1' to 7' by laser processing or the like at the boundary between the adjacent packages.

Next, in Step 2104, the stacked green sheets 1' to 7' can be fired at about 900° C. Next, in Step 2105, an LED element 8 can be die-bonded onto the conductive layer 33 of the glass ceramic layer 3. Then, in Step 2106, the LED element 8 and the conductive layer 33 can be connected by a bonding wire 9. Next, in Step 2107, if desired, the LED element 8 and the bonding wire 9 can be sealed by a sealing resin layer 10.

Figure 24A:
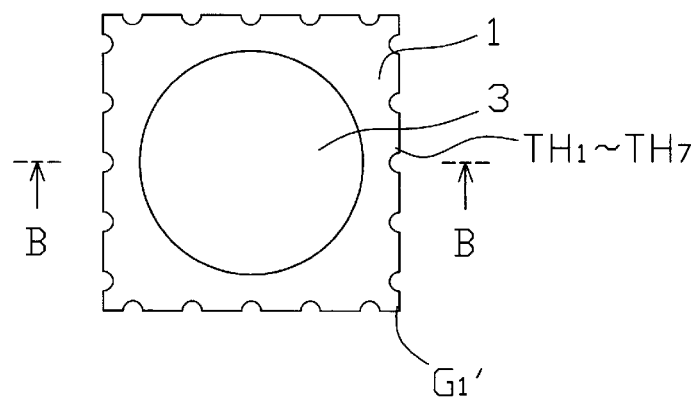
FIGS. 24A and 24B are a plan view of the substrate shown in FIG. 21 and a cross-sectional view of the same, respectively, illustrating a separation process according to the method described in FIG. 21.
Figure 24B:
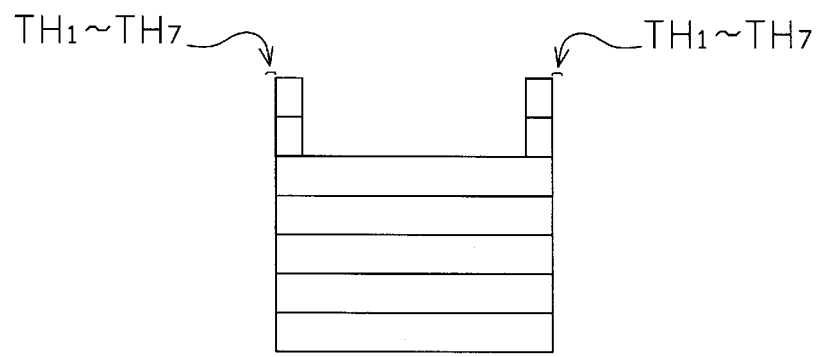

Lastly, in Step 2108, the stacked ceramic layers can be pressed from the glass ceramic layer 1 side to be broken along the lined division through-holes $TH_1$ to $TH_7$, so that the respective low-profile packages for an LED can be separated individually. As a result, the low-profile package for an LED composed of the glass ceramic layers 1 to 7 as shown in FIGS. 24A and 24B can be obtained. In this case, the glass ceramic layers 1 to 7 can be observed to have the half portions of the division through-holes $TH_1$ to $TH_7$.

As discussed above, the third exemplary embodiment can facilitate breakage proceeding in the vertical direction more than the conventional manufacturing method, resulting in further improved manufacturing yield and reduction of manufacturing cost. Simultaneously, since the pressure to be applied to the glass ceramic layers during the separation process can be decreased, the stress applied to the glass ceramic layers can be reduced, and the wear and noise of a separation machine for breaking the ceramic layers can be decreased.

In the above exemplary embodiment as shown in FIGS. 21, 22A, 22B, 23A, 23B, 24A and 24B, the division through-hole is provided to every glass ceramic layer 1 to 7, however, this is not necessary. For example, division through-hole may be provided only to a portion of the glass ceramic layers 1 to 7. In this case, the same advantageous effects such as an increase in manufacturing yield can be achieved when compared to the conventional manufacturing method.

Figure 25A:
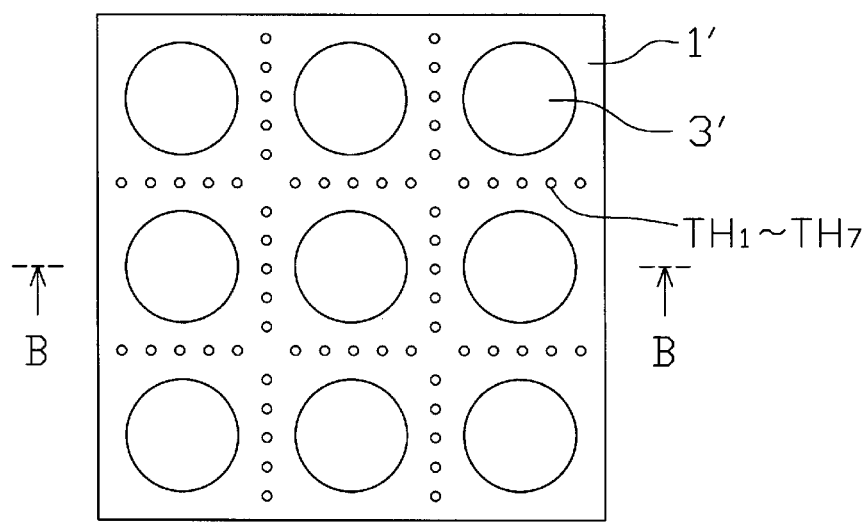
FIG. 25 is a cross-sectional view showing a first modified example of the structure and process shown in FIGS. 23A and 23B.
Figure 25B:
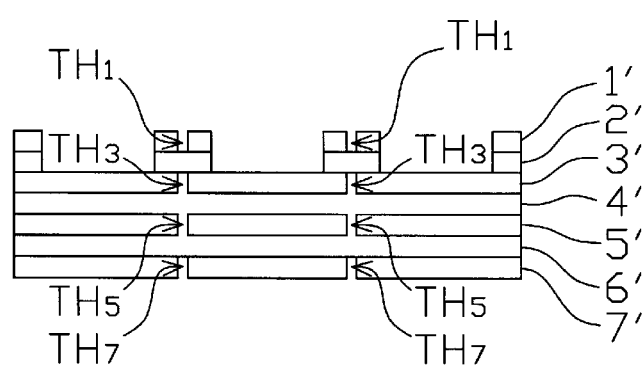

FIG. 25 is a cross-sectional view showing a first modified example of that shown in FIGS. 23A and 23B, and only the division through-holes $TH_1$, $TH_3$, $TH_5$ and $TH_7$ can be provided to the glass ceramic layers 1, 3, 5, and 7, respectively.

In the above exemplary embodiments and their modified examples, the separation process is performed by pressing the glass ceramic layers from the glass ceramic layer 1 side, but the pressing can be performed from the glass ceramic layer 7 side. In this case, in order to facilitate breakage proceeding from the glass ceramic layer 7 to the glass ceramic layer 1, if the division grooves are utilized, not necessarily all of, but a lot of, the division grooves can be formed on the respective opposite surfaces directed in a direction reverse to that shown in the first and second exemplary embodiments.

The manufacturing method in accordance with the presently disclosed subject matter can be applied to, in addition to the ceramic multi-layered interconnection substrate for an LED, ceramic multi-layered interconnection substrate for other semiconductor apparatus, active devices, and passive devices. In addition, it should be understood that each of the different features from the different embodiments disclosed herein can be added to or interchanged with similar feature from other respective embodiments.

It will be apparent to those skilled in the art that various modifications and variations can be made in the presently disclosed subject matter without departing from the spirit or scope of the presently disclosed subject matter. Thus, it is intended that the presently disclosed subject matter cover the modifications and variations of the presently disclosed subject matter provided they come within the scope of the appended claims and their equivalents. All related art references described above are hereby incorporated in their entirety by reference.

What is claimed is:

1. A method for manufacturing a ceramic multi-layered interconnection substrate, comprising:
    providing at least three green sheets, including an uppermost green sheet, at least one intermediate green sheet, and a lowermost green sheet;
    stacking the at least three green sheets;
    forming division grooves in the uppermost green sheet, the at least one intermediate green sheet, and the lowermost green sheet;
    firing the stacked green sheets having been provided with the division grooves to form a plurality of ceramic layers; and
    breaking the plurality of ceramic layers using the division grooves to separate individual ceramic multi-layered interconnection substrates, wherein
    forming the division grooves forms respective division grooves such that a width of the division grooves increases sequentially from the uppermost green sheet, the intermediate green sheet, and the lowermost green sheet in this order.

2. A method for manufacturing a ceramic multi-layered interconnection substrate, comprising:
    providing at least three green sheets, including an uppermost green sheet, at least one intermediate green sheet, and a lowermost green sheet;
    stacking the at least three green sheets;
    forming division grooves in the uppermost green sheet, the at least one intermediate green sheet, and the lowermost green sheet;

firing the stacked green sheets having been provided with the division grooves to form a plurality of ceramic layers; and breaking the plurality of ceramic layers using the division grooves to separate individual ceramic multi-layered interconnection substrates, wherein forming the division grooves forms respective division grooves such that a width of the division grooves decreases sequentially from the uppermost green sheet, the intermediate green sheet, and the lowermost green sheet in this order.

3. A method for manufacturing a ceramic multi-layered interconnection substrate, comprising:

providing at least three green sheets, including an uppermost green sheet, at least one intermediate green sheet, and a lowermost green sheet;

stacking the at least three green sheets;

forming division grooves in the uppermost green sheet, the at least one intermediate green sheet, and the lowermost green sheet;

firing the stacked green sheets having been provided with the division grooves to form a plurality of ceramic layers; and breaking the plurality of ceramic layers using the division grooves to separate individual ceramic multi-layered interconnection substrates, wherein forming the division grooves forms respective division grooves such that a depth of the division grooves increases sequentially from the uppermost green sheet, the intermediate green sheet, and the lowermost green sheet in this order.

4. The method for manufacturing a ceramic multi-layered interconnection substrate according to claim 1, wherein forming the division grooves forms respective division grooves such that a depth of the division grooves increases sequentially from the uppermost green sheet, the intermediate green sheet, and the lowermost green sheet in this order.

5. A method for manufacturing a ceramic multi-layered interconnection substrate, comprising:

providing at least three green sheets, including an uppermost green sheet, at least one intermediate green sheet, and a lowermost green sheet;

stacking the at least three green sheets;

forming division grooves in the uppermost green sheet, the at least one intermediate green sheet, and the lowermost green sheet;

firing the stacked green sheets having been provided with the division grooves to form a plurality of ceramic layers; and breaking the plurality of ceramic layers using the division grooves to separate individual ceramic multi-layered interconnection substrates, wherein forming the division grooves forms respective division grooves such that a depth of the division grooves decreases sequentially from the uppermost green sheet, the intermediate green sheet, and the lowermost green sheet in this order.

6. The method for manufacturing a ceramic multi-layered interconnection substrate according to claim 2, wherein forming the division grooves forms respective division grooves such that a depth of the division grooves decreases sequentially from the uppermost green sheet, the intermediate green sheet, and the lowermost green sheet in this order.

7. The method for manufacturing a ceramic multi-layered interconnection substrate according to claim 1, further comprising, before firing, forming a division through-hole in at least one of the at least three green sheets for use in dividing, and wherein the breaking includes breaking the plurality of ceramic layers using the division grooves as well as the division through-hole.

8. The method for manufacturing a ceramic multi-layered interconnection substrate according to claim 2, further comprising, before firing, forming a division through-hole in dividing in at least one of the at least three green sheets for use in dividing, and wherein breaking includes breaking the plurality of ceramic layers using the division grooves as well as the division through-hole.

9. The method for manufacturing a ceramic multi-layered interconnection substrate according to claim 3, further comprising, before firing, forming a division through-hole in at least one of the at least three green sheets for use in dividing, and wherein breaking includes breaking the plurality of ceramic layers using the division grooves as well as the division through-hole.

10. The method for manufacturing a ceramic multi-layered interconnection substrate according to claim 4, further comprising, before firing, forming a division through-hole in at least one of the at least three green sheets for use in dividing, and wherein breaking includes breaking the plurality of ceramic layers using the division grooves as well as the division through-hole.

11. The method for manufacturing a ceramic multi-layered interconnection substrate according to claim 5, further comprising, before firing, forming a division through-hole in at least one of the at least three green sheets for use in dividing, and wherein breaking includes breaking the plurality of ceramic layers using the division grooves as well as the division through-hole.

12. The method for manufacturing a ceramic multi-layered interconnection substrate according to claim 6, further comprising, before firing, forming a division through-hole in at least one of the at least three green sheets for use in dividing, and wherein breaking includes breaking the plurality of ceramic layers using the division grooves as well as the division through-hole.

13. The method for manufacturing a ceramic multi-layered interconnection substrate according to claim 7, wherein the division through-hole is formed such that the division through-hole is aligned with the division grooves.

14. The method for manufacturing a ceramic multi-layered interconnection substrate according to claim 8, wherein the division through-hole is formed such that the division through-hole is aligned with the division grooves.

15. The method for manufacturing a ceramic multi-layered interconnection substrate according to claim 9, wherein the division through-hole is formed such that the division through-hole is aligned with the division grooves.

16. The method for manufacturing a ceramic multi-layered interconnection substrate according to claim 10, wherein the division through-hole is formed such that the division through-hole is aligned with the division grooves.

17. The method for manufacturing a ceramic multi-layered interconnection substrate according to claim 11, wherein the division through-hole is formed such that the division through-hole is aligned with the division grooves.

18. The method for manufacturing a ceramic multi-layered interconnection substrate according to claim 12, wherein the division through-hole is formed such that the division through-hole is aligned with the division grooves.

* * * * *